United States Patent [19]

Walde et al.

[11] Patent Number: 4,820,106

[45] Date of Patent: Apr. 11, 1989

[54] APPARATUS FOR PASSING WORKPIECES INTO AND OUT OF A COATING CHAMBER THROUGH LOCKS

[75] Inventors: Michael Walde; Jaroslav Zejda, both of Rodenbach, Fed. Rep. of Germany

[73] Assignee: Leybold-Heraeus GmbH, Cologne, Fed. Rep. of Germany

[21] Appl. No.: 92,171

[22] Filed: Sep. 2, 1987

[30] Foreign Application Priority Data

May 16, 1987 [DE] Fed. Rep. of Germany ....... 3716498

[51] Int. Cl.$^4$ .............................................. C23C 14/22
[52] U.S. Cl. .................................. 414/217; 118/719; 414/225
[58] Field of Search ............... 414/217, 222, 223, 225; 118/719

[56] References Cited

U.S. PATENT DOCUMENTS

| | | | |
|---|---|---|---|
| 3,874,525 | 4/1975 | Hassan et al. | 414/225 |
| 3,915,117 | 10/1975 | Schertler | 118/719 |
| 4,355,937 | 10/1982 | Mack et al. | 414/217 |
| 4,523,955 | 6/1985 | Dimock | 414/225 X |
| 4,685,852 | 8/1987 | Rubin et al. | 414/225 X |
| 4,699,554 | 10/1987 | Kawashima et al. | 414/217 |

Primary Examiner—David A. Bucci
Attorney, Agent, or Firm—Felfe & Lynch

[57] ABSTRACT

In an apparatus for passing a discoidal workpiece into and out of a coating chamber through a lock and for shifting the workpiece into and out of the range of a coating source, a swivelling arm is journaled for movement about a vertical axis on the top of the coating chamber. The ends of the swiveling arm have jacks bearing workpiece holding plates which transport the workpiece to an opening in the coating chamber. The workpiece holders are adapted to close off the opening from above. A turntable which can swivel about a vertical axis in the interior of the coating chamber has recesses on its top side for accommodating the workpieces. Lifting plates are journaled in these recesses and can be raised and lowered by lifting means in the bottom plate. The lifting plates are constructed such that, with the turntable in a first position, they pick up the workpieces in the area of the opening and at the same time close off the bottom of the opening, and in a second position they raise the workpieces into the range of action of a cathode.

13 Claims, 6 Drawing Sheets

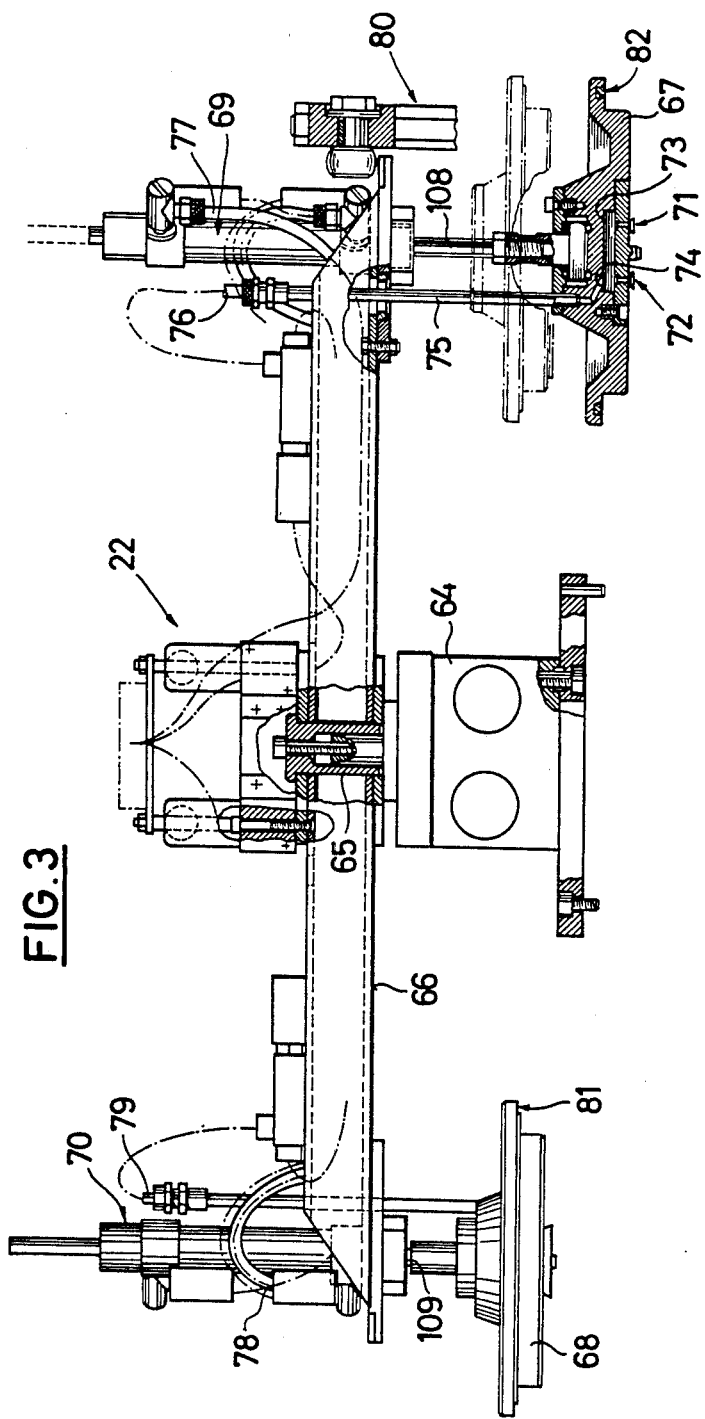
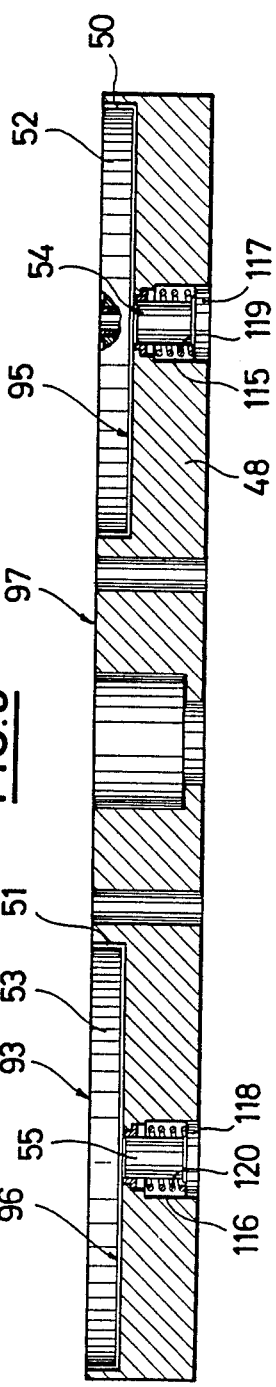
FIG.3
FIG.5

APPARATUS FOR PASSING WORKPIECES INTO AND OUT OF A COATING CHAMBER THROUGH LOCKS

BACKGROUND OF THE INVENTION

The invention relates to an apparatus for passing a substantially flat workpiece into and out of an evacuated coating chamber through airlocks and for moving the workpiece into and out of the range of a coating source for the purpose of treating the workpiece surface.

An apparatus of the kind in question is known (U.S. Pat. No. 3,874,525) which has a coating chamber in which a two-armed gripping tool is journaled on a vertical axis. This two-armed tool has at its diametrically opposite ends forks which can be moved toward and away from one another in a vertical plane by means of a rack-and-pinion drive with a drive motor. Also, two brackets are provided in the coating chamber, one of which is disposed underneath an airlock in the cover of the coating chamber and the other under an electron gun on the side opposite the first bracket.

This known apparatus has the disadvantage that the two-armed gripping tool is of comparatively complex construction and also is not very reliable in operation since the complex rack-and-pinion drive produces momentum. Also, in this apparatus the danger exists that the workpiece will not be perfectly grasped by the fork-like tool and then will be picked up in a canted position or else will completely escape from the tool and drop on the floor of the coating chamber, resulting in a blockage or in the failure of the entire apparatus. Lastly, the known apparatus requires a great amount of head space, which creates the need for an undesirably bulky coating chamber.

The invention is therefore addressed to the task of creating an apparatus which will distinguish itself from known apparatus by greater reliability. Its coating chamber is to have an especially small volume, and it is to be suitable even for particularly delicate, thin-walled workpieces made of flexible material—so-called substrates or wafers.

SUMMARY OF THE INVENTION

This task is accomplished according to the invention with a loading device disposed in the area of the coating chamber, which is provided with one or more cap-like workpiece holders by means of which the workpieces can be brought into a position adjacent the opening of the coating chamber, from which position the opening can be closed on one side by the workpiece holder and on the other side by a lifting plate which is held and guided on a rotatably mounted turntable, the workpiece holder being able to be pressed by a jack supported on the loading device against the opening in the cover of the coating chamber and the lifting plate can be pressed by a lifting means fastened to the bottom plate.

Advantageously, a first opening in the cover of the coating chamber is at a distance from the axis of rotation of the turntable which is the same as the distance from the axis of rotation from a second opening in the cover of the coating chamber, above which the target is disposed.

Desirably, the first opening in the cover of the coating chamber is defined by an entry lock ring fixedly disposed on the cover, which has a stepped bore whose big step is provided on the side facing the workpiece holder, the workpiece holder having a flange-like circumferential marginal portion which is so dimensioned that it can be placed on the step of the entry lock ring to close the opening.

To bring about a reliable separation of the workpiece from the workpiece holder when feeding a workpiece through the lock, and to minimize vacuum loss, the entry lock ring disposed fixedly on the cover of the coating chamber has one or more radially running passages which communicate with further openings or bores which are connected to a pump suction line or a pumping connection, and these passages lead into a portion of the opening of the entry lock ring which consists of the interstice or gap that is formed between the workpiece holder and the lift plate when the workpiece holder is placed on the entry lock ring.

Advantageously the loading device is provided with a swiveling driver which is fixedly disposed on the upper side of the cover of the coating chamber, and whose output shaft is joined co-rotationally with an arm running transversely of the output shaft, a lifting motor or jack being disposed at least at one end of the arm with its shaft or piston rod running perpendicular to the plane of the coating chamber and being operatively connected with the workpiece holder.

The lifting means disposed on the bottom plate of the coating chamber consists advantageously of a magnetic, hydraulic, or pneumatic actuator driving a piston rod or ram which is brought sealingly through the bottom plate and which during its excursion acts upon a stem that is part of the lifting plate which can be lowered into a recess in the turntable.

To assure a reliable and rapid guidance of the workpiece to and from the entry lock station within the coating chamber, the upper side and the bottom side of the turntable are plane-parallel and are spaced away from the inner sides of the cover and bottom plate, while between the turntable and cover a crossbar or sealing bar is fixedly disposed on the inside surface of the cover so as to divide the narrow space remaining between the turntable and cover into two sections in order largely to prevent any flow of gases from one section to the other.

Additional details and features are described and characterized in detail in the subordinate claims.

BRIEF DESCRIPTION OF THE DRAWING

The invention admits of a great variety of embodiments, one of which is shown in detail in the appended drawings as follows:

FIG. 3 is an enlarged view of part of the coating apparatus of FIG. 1, partially in cross section, FIG. 5 is a longitudinal section through the turntable of the coating chamber.

DETAILED DESCRIPTION OF PREFERRED EMBODIMENT

Figure 1:
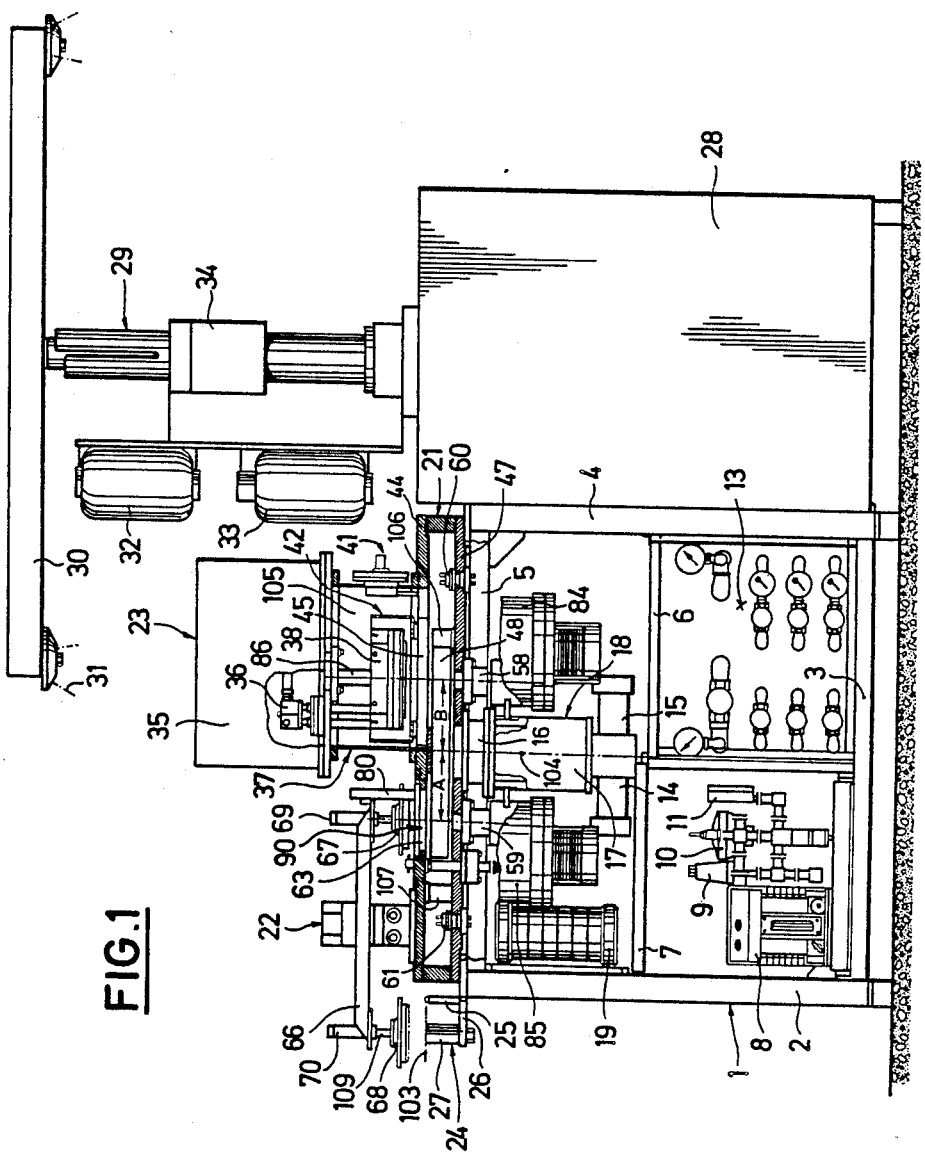
FIG. 1 shows in side elevation an apparatus for coating discoidal workpieces (wafers), which consists substantially of the machine frame, the electrical control box, the cathode chamber, the coating chamber, the coating apparatus and the arm.

As FIG. 1 shows, the box-like machine frame 1 is composed of several structural members 2 7; a vacuum pump 8 with the vacuum control unit consisting of an air inlet filter 10 and a pressure switch, and a water battery 13 are held on the bottom structural member 3. The middle frame formed by the structural members 6 and 7 bears the swiveling driver 18, consisting of one of the two pneumatic actuators 14 and 15, the bracket 16 and the torsion damper 17. On the vertical member 2 is a valve block 19 for supplying compressed air to different units. The upper frame formed by the structural members 5 bears the coating chamber generally identified at 21, on whose bottom the loading device 22 and the cathode chamber 23 are disposed. With the loading device there is associated the workpiece feeder 24 which in this embodiment consists of an arm 26 with the post 27 and a photoelectric cell 25, but can just as well consist of a conveyor belt or an automatically operating device.

Beside the machine frame 1 there is a control cabinet 28 which contains the electrical control means not further represented. On the top of the control cabinet 28 is the upright pivot tube 29 of a swiveling boom 30 of adjustable height, with the hangers 31 and the compressed air reservoirs 32 and 33 and the compressed-air motor 34 for driving the crane arm 30.

Figure 2:
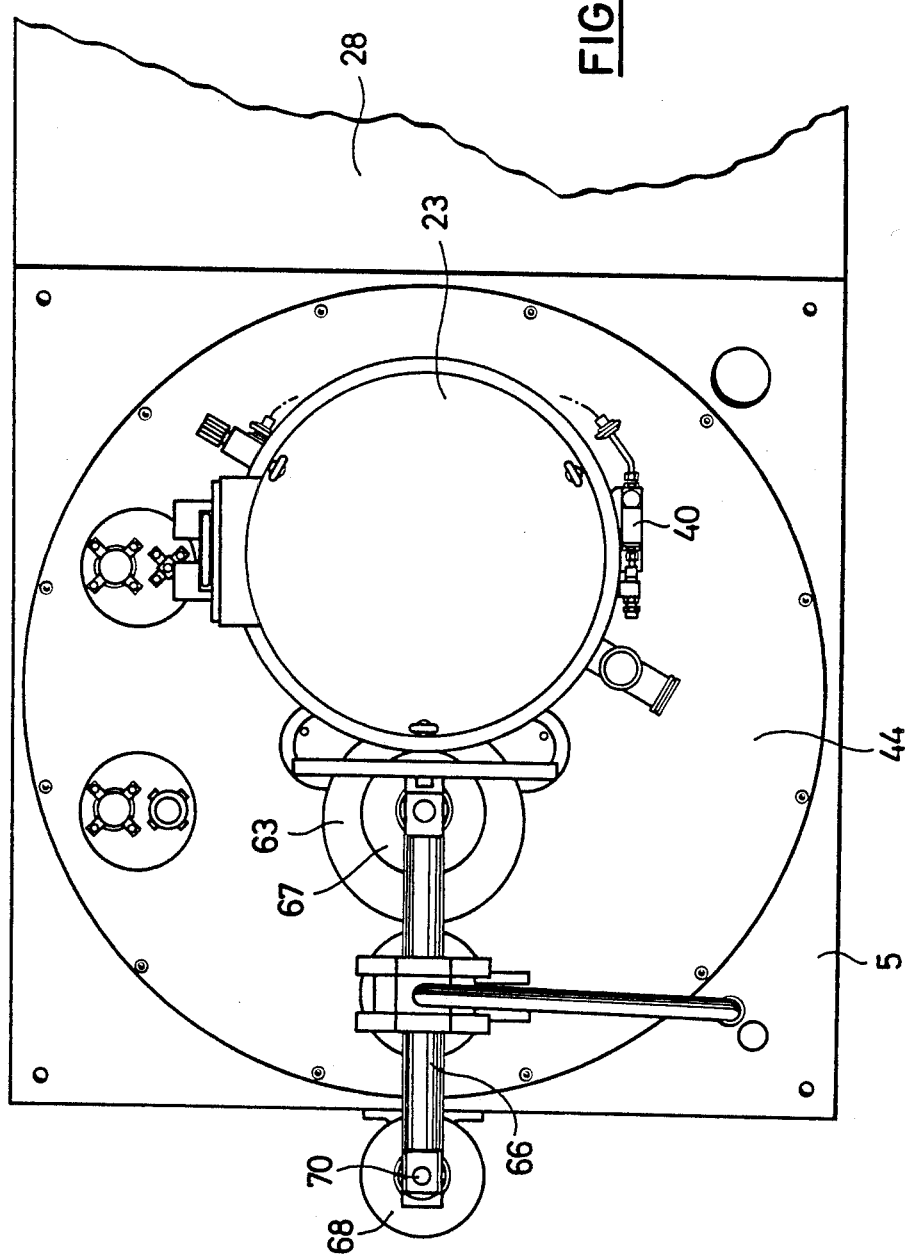
FIG. 2 is a top view of a portion of the apparatus of FIG. 1.
Figure 4:
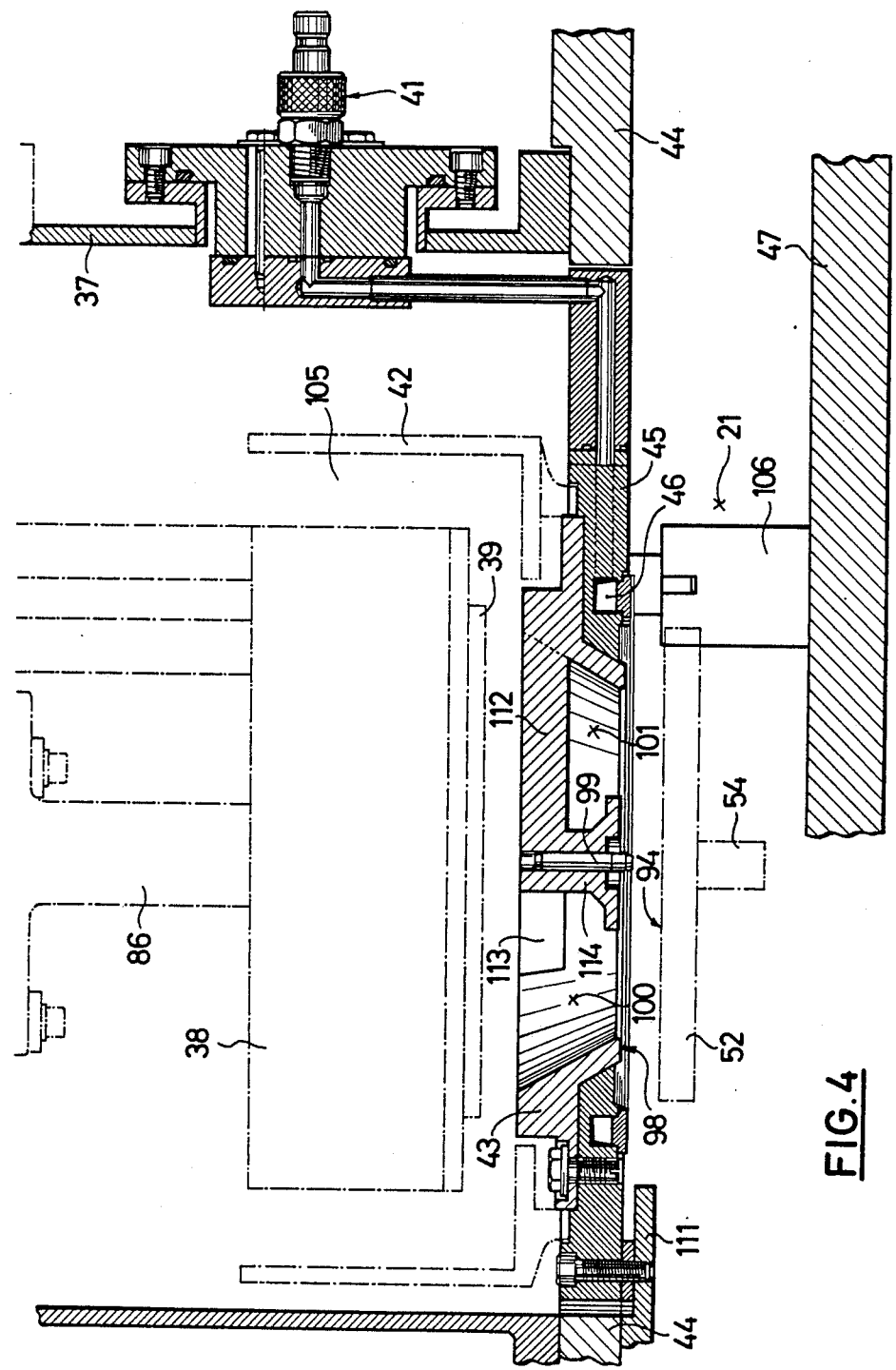
FIG. 4 is an enlarged cross-sectional view of the bottom part of the cathode chamber of FIG. 1, in which parts of the coating chamber are represented in broken lines.

The cathode chamber 23 consists of an upper part 35 to accommodate the coolant inlet and outlet 36 and the electrical terminals which are not represented. In the bottom part 37 of the cathode chamber 23 are contained the cathode 38 and the target 39 (FIG. 4) at the cathode-holder 86 (FIG. 1) in the cathode chamber 105. Also provided in the bottom part 37 are a device 40 (FIG. 2) for the controlled delivery of gas (FIG. 2) and a water fitting 41 (FIG. 1).

The cathode 38, which is a coating source suitable for the PVD (physical vapor deposition) process, is partially surrounded by shielding 42 (FIG. 4) and separated at the bottom from the coating chamber 21 by a mask 43. The mask 43 is held, together with the shielding 42, on a projection 102 of the coating chamber 21 and supported on the spacers 106 on the bottom plate 47. The flange 45 that bears the mask 43 and the shielding 42 is provided with cooling passages 46.

In the coating chamber 21, between the cover 44 and the bottom plate 47, the turntable 48 is journaled on the shaft 49 (FIG. 6) of the swiveling driver 18. The turntable 48 (FIG. 5) is provided on its top with recesses 50 and 51 for containing lifting plates 52 and 53 which have stems 54 and 55 corresponding to the plungers 56 and 57 of the lifting means 58 and 59 mounted on the bottom plate 47.

Figure 7:
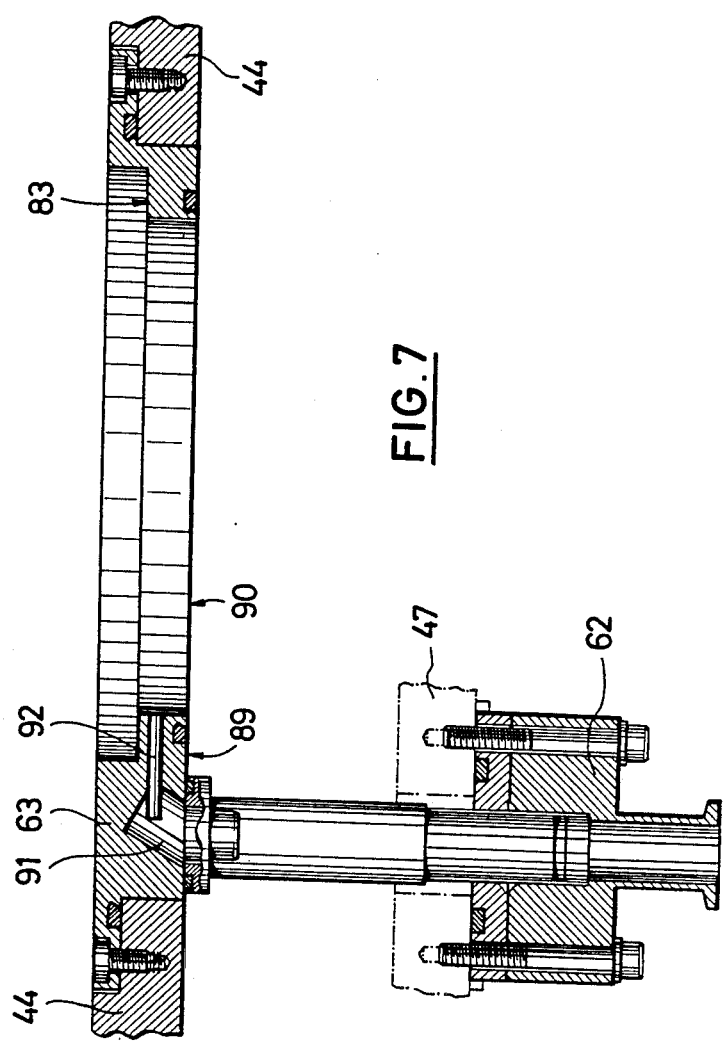

The bottom plate 47 of the coating chamber 21 furthermore has light-pipe lead-throughs 60 and 61 and a vacuum pump connection 62 which is shown in FIG. 7 together with the entry lock ring 63 which in turn is fastened to the cover 44. Lastly, the bottom plate 47 also bears the two vacuum pumps 84 and 85.

The loading device 22 disposed on the cover 44 is represented in greater detail in FIG. 3, and consists of a swiveling driver 64 with shaft 65, an arm 66, the two workpiece holders 67 and 68, and the pneumatically powered jacks 69 and 70 connected to the valve block 19 through hose conduits 77, 78. Lastly, another photoelectric cell 80 is fastened to the cover 44 of the coating chamber 21 and senses the position of the workpiece holders 67 and 68.

Figure 6:
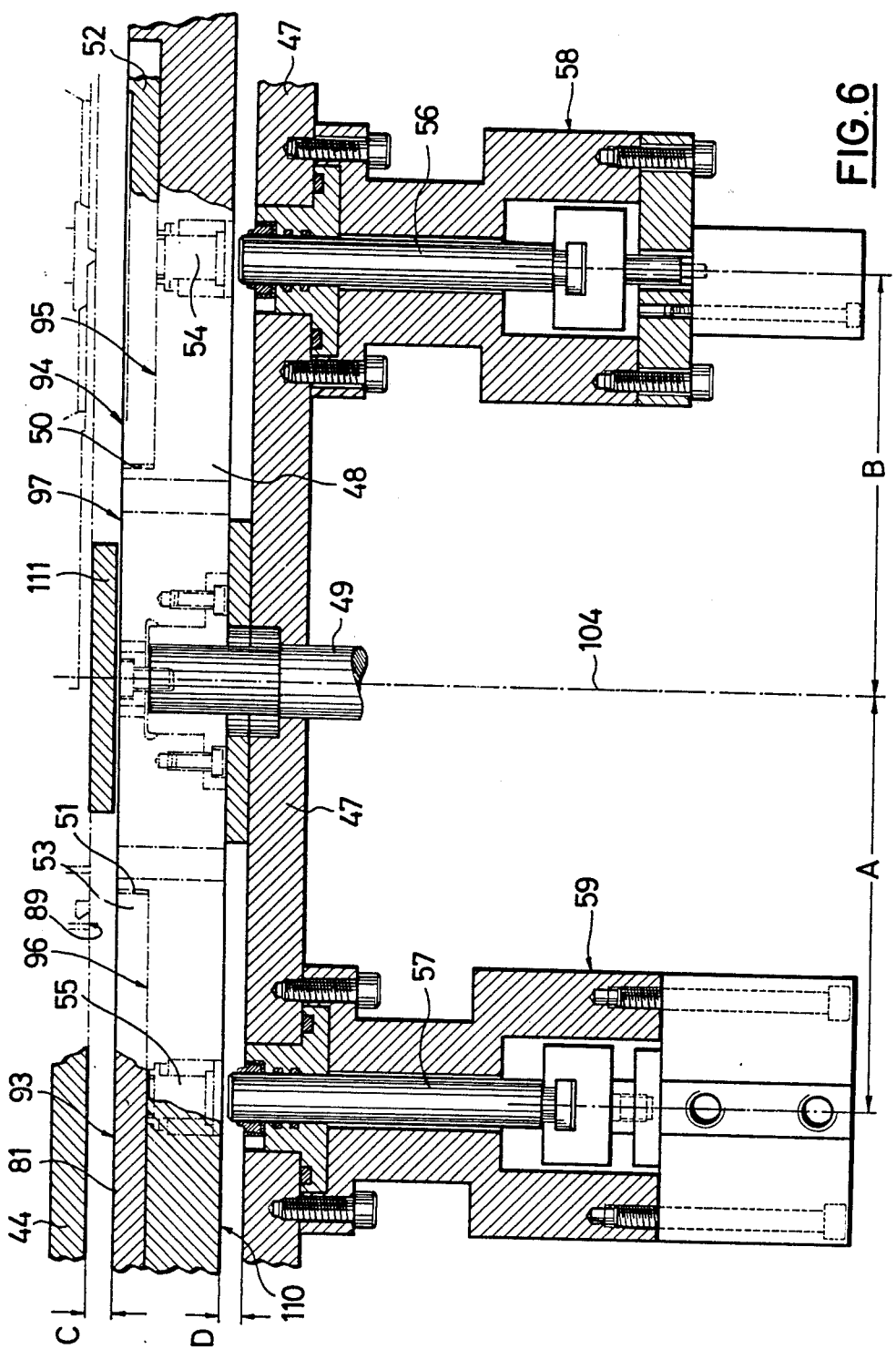
FIG. 6 is a longitudinal cross section of the device for raising the discoidal workpieces (wafers) and FIG. 7 is a longitudinal cross section of the entry lock ring.

The loading system 22 operates as follows: As soon as a workpiece 103 (e.g., a circular plastic holder, a so-called substrate, or a wafer) is laid on the post 27 of the workpiece feeder 24, the photoelectric cell 25 gives an electrical signal to the electrical control unit, not shown, which in turn activates the jack which lowers the workpiece holder 67 or 68, which is attached to the piston rod 108 or 109 down onto the workpiece 103 (lower position), where the suction system 71 to 74 (FIG. 3) picks up the workpiece 103. Then the workpiece holder 68 together with the workpiece 103 runs back up to the upper position and the arm 66 driven by the swiveling driver 64 performs a swiveling movement, so that this workpiece holder 68 assumes a second position nearer the cathode 38. When this second position is reached, the jack 70 lowers the workpiece holder 68 or 67 to the point where the workpiece holder (FIG. 3 shows the lowered workpiece holder 67 in this position) rests with its circumferential margin 81 or 82 directly on the step 83 of the entry lock ring 63 (FIG. 7). During this phase the lifting plate 53 is in its upper position wherein it is pressed by the plunger 57 of the lifting means 59 directly against the bottom 89 of the entry lock ring 63 and holds the opening 90 closed. When the air in the gap between the upper side 93 of the lifting plate 53 and the bottom of the workpiece holder 68 is exhausted through the vacuum pump connection 62 and the bores 91 and 92 corresponding to the latter, a vacuum is established immediately after the workpiece holder 68 is lowered, so that the wafer-like workpiece 103 separates from the workpiece holder 68 and deposits itself on the recessed upper side of the lifting plate 53. In a next cycle, the lifting plate 53 is lowered by the pneumatic lifting means 59 to the point where the lifting plate 53 lies on the bottom surface 96 of the recess 51, while the upper side of the lifting plate 53 is precisely flush with the upper side 97 of the turntable 48. After the plunger 57 of the lifting means 59 has assumed the bottom position (as represented in FIG. 6), the swiveling driver 18 goes into action and turns the portion of the turntable 48 that is represented on the left side of the figure to the right-hand position, i.e., to the point where the stem 55 of the turntable 48 is in line with the plunger 56. In this position the lifting means 58 can raise the lifting plate 53 upwardly by means of the plunger 56 and the stem 55 until the workpiece 103, which is lying on the lifting plate 53, comes in contact with the bottom 89 of the mask 43, while the pin 99 precisely positions the workpiece 103 (not shown) which is provided with a central bore. In the next step the workpiece 103 is sputter-coated over the target 39, while the disk-shaped mask 43 provided with openings 100 and recesses 101 and the shielding 42 (FIG. 4) prevent any undesired coating of the inner surface of the bottom part 37 of the cathode chamber 23 and of the turntable 48. In a following cycle, after the workpiece 103 has been coated, the lifting plate 53 is lowered again (as indicated by broken lines in FIG. 4 in the example of the lifting plate 52) and then, by a 180 degree rotation of the turntable 48, it is brought to the position represented in FIG. 6. By the lifting means 59, the lifting plate 53 can now be raised until it is tightly in contact with the bottom 89 of the entry lock ring 63. The evacuation of the gap between the workpiece holder 68 closing off the top of the entry lock opening 90 and the lifting plate 53 pressed against the bottom of the entry lock ring 63, is now shut off so that the suction nozzles 71 and 72 shown in the example of the workpiece holder 67, or suction cups, as the case may be, can pick up the workpiece 103 and the workpiece holder 68 can be lifted by the jack 70 and turned to its initial position (as represented in FIGS. 1 and 3) wherein the jack 70 can again deposit the workpiece 103 on the post 27. The manner of operation described above in regard to the workpiece holder 68 applies accordingly to the workpiece holder 67, and the appended drawings clearly show that, during operation, the one or the other workpiece holder 67 or 68 is alternately situated above the post 27 and above the entry lock ring 63. It can also be seen in the drawings that the turntable 48 moves also from the one position to the other in synchronism with the movement of the arm 66.

The opening 90 in the cover 44 of the coating chamber 21 has a distance A (FIG. 1) from the axis of rotation 104 of the turntable 48, which corresponds to the distance B from the axis of rotation 104 to a second opening in the cover 44 of the coating chamber 21 above which the target is disposed.

The upper side 97 and the lower side 110 of the turntable 48 are plane-parallel and extend at a distance C, D from the inside of the cover 44 and of the bottom plate 47.

An upper side 97 and a lower side 110 (FIG. 6) of the turntable 48 are plane-parallel and extend at a distance C, D from the inside of the cover 44 and of the bottom plate 47, a crossbar or sealing bar 111 (FIG. 6) being disposed fixedly on the inside surface of the cover 44 between the turntable 48 and the cover 44, and dividing a gap-like space remaining between turntable 48 and cover 44 into two sections and largely preventing any overflow of gases from one to the other section.

In the area of a cathode chamber 23 between a target 39 and the turntable 48 there is provided in the cover 44 of the coating chamber 21 an opening into which a flange 45 containing cooling passages 46 is inserted, on which a collar-like mask 43 is fixedly disposed, the mask 43 having one or more arms 112, 113 (FIG. 4) extending inwardly, which form a common central section 114 which holds a centering pin 99 extending in a direction of the turntable 48.

A flange 45 inserted in the cover 44 of the coating chamber 21 rests against a sealing bar 111 disposed between the turntable 48 and the cover 44.

The turntable 48 disposed between the cover 44 and the bottom plate 47 is joined co-rotationally with a drive shaft 49 of a swiveling driver 18 which is brought sealingly through the bottom plate 47, the turntable 48 having one or more recesses 50, 51 corresponding at least to a thickness of the lifting plate 52, 53, which recesses are made in an upper side 97 of the turntable and have a breadth transversely of the axis of rotation 104 of the turntable 48 which corresponds to the configuration of the lifting plates 52, 53, a bore 115, 116 being provided in an area of each recess 50, 51 which serves to accommodate a stem 54, 55 which is joined to the lifting plate 52, 53 held and guided in the recesses 50, 51.

A bore 115, 116 in the turntable 48 is a stepped bore and a stem 54, 55 has a head portion or collar 117, 118 on which a compression spring 119, 120 surrounding a shaft of the stem 54, 55 thrusts and another end of the spring engaging a small step of the bore 115, 116 and drawing the corresponding lifting plate 52, 53 into a corresponding recess 50, 51 in the turntable 48.

We claim:

1. Apparatus for passing a substantially flat workpiece into and out of an evacuated coating chamber through a lock, and for moving and turning the workpiece into and out of the range of a coating source for the purpose of treating the workpiece surface, characterized by a coating system disposed in the area of the coating chamber and having one or more cap-like workpiece holder means for bringing the workpieces into a position, adjacent an opening in a cover of the coating chamber, and for closing the opening on one side, a lifting plate means held and guided on a turntable rotatably mounted within the coating chamber for the closing the other side of the opening, the workpiece holder means being able to be pressed against the opening in the cover of the coating chamber by a jack supported on the loading device, and the lifting plate means being able to be pressed against the opening by a lifting means fastened to a bottom plate.

2. Apparatus according to claim 1, characterized in that a first opening (90) in the cover (44) of the coating chamber (21) has a distance (A) from an axis of rotation (104) of the turntable (48), which corresponds to a distance (B) from the axis of rotation (104) to a second opening in the cover (44) of the coating chamber (21) above which a target is disposed.

3. Apparatus according to claim 2, characterized in that the first opening in the cover (44) of the coating chamber (21) is defined by an entry lock ring (63) fixedly disposed on the cover (44), which ring has a stepped bore whose large step (83) is provided on a side facing the workpiece holder (67, 68), the workpiece holder (67, 68) having a flange-like circumferential marginal portion (81, 82) which is so dimensioned that it can be placed on the step (83) of the entry lock ring (63) to close the opening (90).

4. Apparatus according to claim 3, characterized in that the entry lock ring (63) disposed fixedly on the cover (44) of the coating chamber has one or more radially extending passages (92) which correspond to additional openings or bores (91) which are connected to a pump suction line or to a pumping connection (62), the passages (92) leading into an area of the opening (90) of the entry lock ring (63) which is formed by an interstice or gap formed by the workpiece holder and lifting plate when the workpiece holder (67, 68) and lifting plate (52, 53) are placed on the entry lock ring (63).

5. Apparatus according to claim 1, characterized in that the locating device (22) has a swiveling driver (64) fixedly disposed on an upper side of the cover (44) of the coating chamber (21), an output shaft (64) of the swiveling driver being joined co-rotationally with an arm (66) extending transversely of the output shaft, a lifting motor or lifting jack (69, 70) being disposed on at least one end of the arm, a work shaft or piston rod (108, 109) of the lifting jack being perpendicular to a plane of the coating chamber (21) and being operatively connected with the workpiece holder (67, 68).

6. Apparatus according to claim 1, which includes a raising and lowering device and characterized in that the raising and lowering device (58, 59) comprises a magnetically, hydraulically or pneumatically powered motor which drives a piston rod or a plunger (56, 57) which is brought sealingly through the bottom plate (47) and which during its excursion acts upon a pin (54, 55) which is part of the lifting plate (52, 53) which can be lowered into a recess (50, 51) of the turntable (48).

7. Apparatus according to claim 1, characterized in that an upper side (97) and a lower side (110) of the turntable (48) are plane-parallel and extend at a distance (C, D) from an inside surface of the cover (44) and of the bottom plate (47), a crossbar or sealing bar (111) being disposed fixedly on the inside surface of the cover (44) between the turntable (48) and the cover (44), and dividing a gap-like space remaining between turntable (48) and cover (44) into two sections and largely preventing any overflow of gases from one to the other section.

8. Apparatus according to claim 1, characterized in that in an area of a cathode chamber (23) between a target (39) and the turntable (48) there is provided in the cover (44) of the coating chamber (21) an opening into which a flange (45) containing cooling passages (46) is inserted, on which a collar-like mask (43) is fixedly disposed, the mask (43) having one or more arms (112, 113) extending inwardly, which form a common central section (114) which holds a centering pin (99) extending in a direction of the turntable (48).

9. Apparatus according to claim 1, characterized in that a ring or flange (45) inserted into the cover (44) of the coating chamber (21) between a target (39) and turntable (48), has a shielding (42) which is largely in the form of a hollow cylinder and at least partially surrounds a cathode (38).

10. Apparatus according to claim 1, characterized in that a flange (45) inserted in the cover (44) of the coating chamber (21) rests against a sealing bar (111) disposed between the turntable (48) and the cover (44).

11. Apparatus according to claim 1, characterized in that between the cover (44) and the bottom plate (47) one or more spacers (106, 107) are disposed, a flange (45) inserted into the cover (44) being supported and held on at least one of these spacers (106, 107).

12. Apparatus according to claim 1, characterized in that the turntable (48) disposed between the cover (44) and the bottom plate (47) is joined co-rotationally with a drive shaft (49) of a swiveling driver (18) which is brought sealingly through the bottom plate (47), the turntable (48) having one or more recesses (50, 51) corresponding at least to a thickness of the lifting plate (52, 53), which recesses are made in an upper side (97) of the turntable and have a breadth transversely of the axis of rotation (104) of the turntable (48) which corresponds to the configuration of the lifting plates (52, 53), a bore (115, 116) being provided in an area of each recess (50, 51) which serves to accommodate a stem (54, 55) which is joined to the lifting plate (52, 53) held and guided in the recess (50, 51).

13. Apparatus according to claim 1, characterized in that a bore (115, 116) in the turntable (48) is a stepped bore and a stem (54, 55) has a head portion or collar (117, 118) on which a compression spring (119, 120) surrounding a shaft of the stem (54, 55) thrusts and another end of the spring engaging a small step of the bore (115, 116) and drawing the corresponding lifting plate (52, 53) into a corresponding recess (50, 51) in the turntable (48).

* * * * *

UNITED STATES PATENT AND TRADEMARK OFFICE
CERTIFICATE OF CORRECTION

PATENT NO. : 4,820,106

DATED : April 11, 1989

INVENTOR(S) : Michael Walde et al

It is certified that error appears in the above-identified patent and that said Letters Patent is hereby corrected as shown below:

Column 3, line 7, for "∫" read a dash -- - --.

Column 6, line 19 for "the loading" read -- a loading --.

Signed and Sealed this

Third Day of July, 1990

*Attest:*

HARRY F. MANBECK, JR.

*Attesting Officer*     *Commissioner of Patents and Trademarks*